United States Patent [19]

Temple

[11] Patent Number: 4,622,572

[45] Date of Patent: Nov. 11, 1986

[54] HIGH VOLTAGE SEMICONDUCTOR DEVICE HAVING AN IMPROVED DV/DT CAPABILITY AND PLASMA SPREADING

[75] Inventor: Victor A. K. Temple, Jonesville, N.Y.

[73] Assignee: General Electric Company, Schenectady, N.Y.

[21] Appl. No.: 446,841

[22] Filed: Dec. 6, 1982

Related U.S. Application Data

[63] Continuation of Ser. No. 290,132, Aug. 5, 1981, abandoned, which is a continuation-in-part of Ser. No. 152,742, May 23, 1980, abandoned.

[51] Int. Cl.[4] ............................................. H01L 29/74
[52] U.S. Cl. ...................................... 357/38; 357/20; 357/23.6; 357/55; 357/68; 357/86
[58] Field of Search .................... 357/38, 86, 20, 23, 357/55, 68

[56] References Cited

U.S. PATENT DOCUMENTS

| | | | |
|---|---|---|---|
| 3,368,121 | 2/1968 | Herlet et al. | 357/38 |
| 3,619,738 | 11/1971 | Otsuka | 357/38 |
| 4,047,219 | 9/1977 | Temple | 357/38 |
| 4,224,634 | 9/1980 | Suedberg | 357/38 |
| 4,243,997 | 1/1981 | Natori et al. | 357/23.4 |

FOREIGN PATENT DOCUMENTS

| | | | |
|---|---|---|---|
| 53-23283 | 3/1978 | Japan | 357/38 P |
| 55-30851 | 3/1980 | Japan | 357/38 E |
| 2038554 | 7/1980 | United Kingdom | 357/38 P |

OTHER PUBLICATIONS

D. Hamilton et al., "Basic Integrated Circuit Engineering", ©1975 McGraw–Hill, Inc., pp. 14, 15.

Primary Examiner—Joseph E. Clawson, Jr.
Attorney, Agent, or Firm—John R. Rafter; James C. Davis, Jr.; Marvin Snyder

[57] ABSTRACT

A semiconductor device used for high voltage applications exhibits reduced susceptibility to being inadvertently turned-on by capacitive charging currents generated by relatively high voltage transients impressed across an anode and a cathode of the device. The capacitive charging currents are manifested as a gate current which in a thyristor renders the device conductive if it exceeds a critical value and in a transistor is multiplied by the current gain. Various embodiments employing capacitors are disclosed for reducing the level and/or the duration of the transient produced gate current.

9 Claims, 3 Drawing Figures

HIGH VOLTAGE SEMICONDUCTOR DEVICE HAVING AN IMPROVED DV/DT CAPABILITY AND PLASMA SPREADING

This is a continuation of application Ser. No. 290,132, filed Aug. 5, 1981 which is a continuation-in-part of application Ser. No. 152,742, filed May 23, 1980, now abandoned and is assigned to the same assignee as the instant invention.

RELATED APPLICATIONS

This application is related to V. A. K. Temple application Ser. No. 152,772, filed May 23, 1980 (now U.S. Pat. No. 4,261,001, issued Apr. 7, 1981), and to V. A. K. Temple application Ser. No. 152,770, also filed May 23, 1980 (now U.S. Pat. No. 4,261,000, issued Apr. 7, 1981), both of which are assigned to the instant assignee.

BACKGROUND OF THE INVENTION

This invention relates to semiconductor switching devices and more particularly, to high voltage semiconductor switching devices having reduced susceptibility to inadvertent device turn-on due to high voltage transients.

Thyristors, triacs and transistors are semiconductor devices often used to turn-on and turn-off high voltage sources. These devices include at least first and second main current carrying electrodes and a gate electrode. A main voltage is applied across the first and second electrodes such that a main current flows therebetween upon application of a control signal to the gate electrode. The device is said to be in a turned-on state when conduction current flows between the first and second electrodes. Because the device has an internal junction capacitance its forward voltage is applied to its main terminals. A steep rising voltage impressed across the main terminals may cause a capacitive charging current to flow through the device. The charging current ($i = C_j dv/dt$) is a function of the inherent junction capacitive value and the rate of rise of the impressed voltage. If the rate of rise of impressed voltage exceeds a critical value, the capacitive charging current may be large enough to generate a gate current at a sufficient level and for a sufficient time to turn-on the device. The ability of the device to withstand an impressed voltage transient across its main terminals is commonly termed the dv/dt capability specified in volts/microseconds. The dv/dt capability becomes of particular importance when voltage transients are impressed across the main terminals of the device. Voltage transients occur in electrical systems when some disturbance disrupts the normal operation of the system or even in normal circuit operation when other devices in the system switch on or off. Voltage transients generally have a fast rate of rise that may be greater than the dv/dt capability of the device. If the rate of rise of the transient exceeds the dv/dt capability of the thyristor, for example, it may cause the device to be inadvertently turned-on.

There are a number of known methods for increasing the dv/dt capability of the semiconductor device. One such method is the use of "emitter shorts" in a relatively large emitter area of a semiconductor device. Disadvantages that may occur with the use of emitter shorts are that the gate current required to activate the semiconductor device is increased and the di/dt rating of the device is also decreased.

Another known method of improving the dv/dt capability of the semiconductor device is the use of interdigitation. Interdigitation increases the initial turn-on area of the emitters and correspondingly reduces the turn-on sensitivity of the device to gate current. The interdigitation approach raises problems related to packaging as well as increasing gate current requirements.

A still further known method of increasing the dv/dt capability of the semiconductor device is the use of a resistor connected between the gate and the cathode of the semiconductor device, which provides a shunt path to divert a portion of the transient generated gate current away from the emitter of the cathode. The use of a resistive shunt path for the gate signal reduces the gate sensitivity of the semiconductor device as well.

The present invention concerns a high voltage semiconductor device in which the dv/dt capability of the device is increased by decreasing the amount of the transient capacitive charging currents conducted to the emitters of the device.

One object of the present invention is to provide circuit means externally connected to the semiconductor device to cause a relatively large increase in the dv/dt rating of the device but with a relatively small decrease in gate sensitivity.

Another object of the present invention is to provide a semiconductor device in which means are incorporated for increasing the dv/dt rating of the device with but minimal effect on the other parameters of the device.

A still further object of the present invention is to provide a semiconductor device in which the speed of a plasma created upon initial turn-on of the device is increased.

These and other objects of the invention will become apparent to those skilled in the art upon consideration of the following description of the invention.

SUMMARY OF THE INVENTION

In accordance with one preferred embodiment of the invention, a high voltage semiconductor device comprises at least a first cathode including a first metallization layer, a second cathode including a second metallization layer, an anode, and a gate region adapted to receive an applied signal. Each of the first and second cathodes has an emitter layer affixed thereunder and each cathode is separated from the anode by at least a first and second layer of alternating conductivity-type material. The second cathode and the anode are adapted to be coupled between opposite ends of a relatively high voltage potential source having periodic relatively high voltage transients. Periodic occurrences of the voltage transients between the second cathode and the anode generate capacitive charging currents within the first and second layers which are manifested as gate current in the emitter layers of the first and second cathodes. The gate current in the emitter layer of the first cathode, if unreduced in amplitude, is of a sufficient value to cause conduction between the first cathode and the anode. The high voltage semiconductor device further comprises capacitive means coupled to the gate region to provide a capacitive shunt path for diverting a portion of transient generated capacitive charging current flowing within the gate region away from the emitter layer of the first cathode and that part of the first layer laing thereunder, such that the transient generated capacitive charging currents which are manifested as the gate current are reduced, thereby improving the dv/dt capability of the high voltage semiconductor device.

The features of the invention believed to be novel are set forth with particularity in the appended claims. The invention, itself, however, both as to its orgranization and operation, together with further objects and advantages thereof, may best be understood by reference to the following description taken in conjunction with the accompanying drawings.

DETAILED DESCRIPTION OF THE PREFERRED EMBODIMENT

Figure 1:
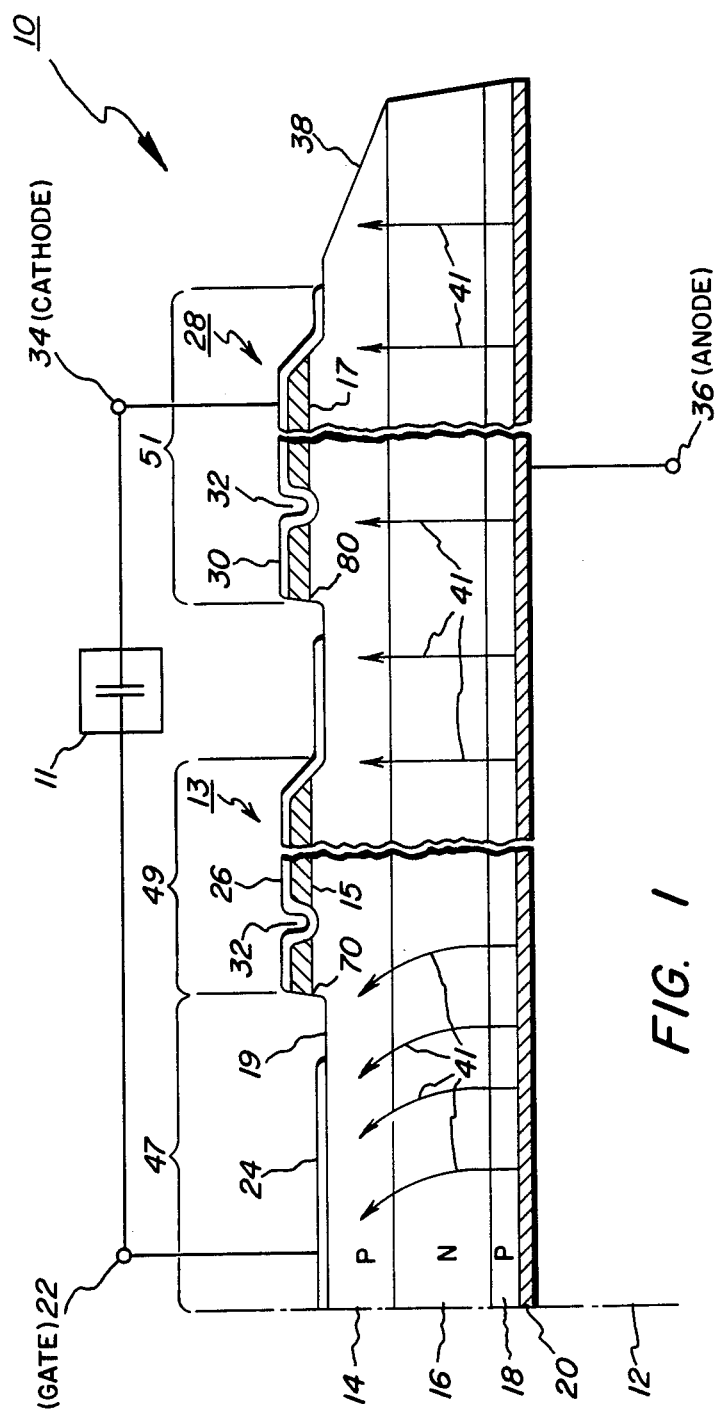
FIG. 1 illustrates a partial cross-section of one preferred embodiment of the present invention in which an impledance is employed to provide a shunt path for transient gate current.

FIG. 1 shows a partial cross-section of a semiconductor device 10 in a center-gated amplifying thyristor configuration exemplifying one embodiment of the present invention. Device 10 has an anode base layer 16 of an N-type semiconductor material and a P-type semiconductor material forming a layer 18 which is situated beneath and in contact with the layer 16. A cathode-base layer 14 of P-type semiconductor material is situated above and in contact with the layer 16. Layers 14 and 16 have a beveled surface 38 located at their outer peripheries for improved avalanche breakdown voltage. Semiconductor layer 14 furnishes a major portion of a top surface 19 of the semiconductor device 10. Semiconductor layer 16 generally constitutes the substrate of the device 10 with layers 14 and 18 being formed by diffusion and/or epitaxial growth. Device 10 includes a pilot thyristor 13 and a main thyristor 28 each having an additional high conductivity n+ layer shown respectively as 15 and as 17. The n+ layer 15 constitutes the emitter of the pilot thyristor 13. Similarly, the n+ layer 17 constitutes the emitter of the main thyristor 28. The emitter 15 is overlaid with a metallization layer 26, herein termed the pilot stage cathode electrode or first cathode electrode. Similarly, the emitter 17 is overlaid with a metallization layer 30, herein termed the main stage cathode electrode or second cathode electrode. Emitter 15 and layer 26 comprise the pilot stage cathode while emitter 17 and layer 30 comprise the main stage cathode.

Metallization layer 30 provides a contact for connecting one end of a relatively high voltage source via terminal 34. Metallization layers 26 and 30, if desired, have conventional emitter shorts 32 formed in their top portions and extending into region 14. A further metallization layer 24, herein termed the gate of device 10, overlays cathode-base layer 14. Gate 24 may be connected to an electrical gate signal source via terminal 22. In one form of a photo-sensitive amplifying gate thyristor 10 a light signal may impinge upon part or all of gate region 47. For this purpose, electrode 24 is selected to be transparent to the incident light radiation, or maintained with small area to allow sufficient light to impinge on surface 19 in gate region 47 in order to trigger the device.

A still further metallization layer 20 is positioned under layer 18 and provides a means for connecting the other end of the high voltage source to the device 10 via terminal 36. Metallization layer 20 is herein termed the anode of device 10.

Semiconductor device 10, as shown in FIG. 1, includes a gate region 47 extending from a centerline 12 to a leading edge, or turn-on line, 70 of pilot thyristor 13, a pilot thyristor region 49 extending from the termination of gate region 47 to the termination of emitter 15 of pilot thyristor 13, and a main thyristor region 51 beginning at a turn-on line 80 and spanning the emitter 17 of the main thyristor 28. The leading edge of the pilot thyristor on the side closest to gate region 47, and thereby being leading relative to the gate region.

As previously discussed, occurrences of voltage transients impressed across the cathode and anode of a semiconductor device, such as device 10, may cause capacitive charging currents to flow within device 10. The capacitive charging currents are shown in FIG. 1 as a plurality of arrows 41 emerging from anode 20 and flowing upward through layers 18, 16, and 14 towards the top portion 19 of device 10. A portion of the transient capacitive charging currents may be manifested as a gate current of sufficient value to exceed a critical value and render the main thyristor 28 conductive, thus inadvertently turning on device 10. Similarly, a portion of the transient generated capacitive charging currents 41 may also intercept and render conductive the pilot thyristor 13, thus also inadvertently turning on device 10.

In the embodiment of FIG. 1, an impedance means 11 is provided to reduce the susceptibility of device 10 to inadvertent turn on by voltage transients. Reducing the susceptibility of inadvertent turn on correspondingly increases the dv/dt capability of device 10.

Impedance means 11 is connected between gate 24 and second cathode electrode 30 to provide a shunt path for a portion of the transient capacitive charging currents. Thus impedance means 11 provides a shunt or parallel path to conduct a portion of the transient generated capacitive charging currents away from emitters 15 and 17, and thereby provides the shunt path for most of the transient capacitive charging currents flowing within gate region 47.

Impedance means 11 is comprised of a capacitor having a substantially non-dissipating energy characteristic and a relatively low impedance to fast transients. Use of a capacitive shunt increases the dv/dt capability of the semiconductor device but increases the turn-on delay time of device 10, and, in general, somewhat reduces the di/dt rating of device 10. For reasons explained infra, the value of capacitor for impedance means 11 is selected with consideration given to the increased dv/dt capability obtained and also to the resulting increased turn-on delay and correspondingly decreased di/dt rating of device 10.

It will be appreciated that use of capacitive shunt 11 having a low impedance to rapid transient currents diverts a portion of the capacitive charging currents 41 away from the emitters 15 and 17 and thereby decreases the dv/dt derived gate current that is applied to the pilot thyristor 13 and main thyristor 28. The gate current as a function of time, herein termed $I_G(t)$, is approximately represented by the following relationship:

$$I_G(t) = C_J dv/dt(1 - e^{(T/\tau_G)}) \quad (1)$$

where $C_J$ = the junction capacitance of the gate region 47;
t = elapsed time during the voltage transient;
$C_J dv/dt$ = the capacitive charging currents generated by the voltage transients;
$\tau_G \approx = (C_J + C_{11}) \cdot R_{GK}$ for the time duration t, wherein
$C_{11}$ = capacitive value of impedance means 11; and
$R_{GK}$ = resistance value between gate electrode 24 and second cathode electrode 30.

The symbol $\tau_G$ is herein termed the gate 24-to-cathode 30 time constant. It should be recognized that the value of $\tau_G$ for device 10 having an inherent capacitive $C_J$ and resistance $R_{GK}$ may be chosen by appropriate selection of a capacitive value for $C_{11}$.

After a time duration $t_{ramp}$ when the voltage transient generating the capacitive charging current ceases, $I_G$ may be approximately represented by the following relationship for times greater than $t_{ramp}$:

$$I_G(t) = I_G(t_{ramp}) \exp(-(t - t_{ramp})/t_a) \quad (2)$$

where $t_a$ is the time constant measuring the decay of $I_G$.

Equation (1) may be integrated over the $t_{ramp}$ time duration to determine the charge delivered to the gate during $t_{ramp}$ and then the result of equation (1) may be added to the integral of equation (2) for time durations greater than $t_{ramp}$ to determine the total charge delivered to gate 24, having impedance means 11 attached, by the dv/dt gate current. The determined charge may then be compared to a charge that would have been developed without the capacitance of impedance means 11 connected between gate 24 and second cathode electrode 30. The resulting comparison would be representative of an improved dv/dt factor F, which may be approximately represented by the following relationship:

$$F = \frac{1}{1 - e^{-(t_{ramp}/\tau_G)}} \quad (3)$$

As previously mentioned, while impedance 11 improves the dv/dt capability of device 10 it also increases the turn-on time of device 10 to the degree that impedance means 11 takes away gate current from gate 24. In most thyristor applications for relatively low speed switching, such as <1 kHz, a $\tau_G$ in the order of 20μ seconds will not substantially degrade the performance of device 10. If the switching speed needed for the thyristor's use is >1 kHz, then $\tau_G$ should normally be chosen to be no more than a few microseconds.

It should be recognized that impedance means 11 reduces the rise-time of the normal gate current signal applied to gate 24 under normal firing conditions. Hence, the turn-on speed and the di/dt rating of device 10 may be affected under normal firing conditions. To investigate the degree of reduction in turn-on di/dt of an amplifying gate thyristor corresponding to improved dv/dt factors F, experiments were performed, the results of which are shown in Table I. These results present measured turn-on speeds in units of di/dt.

The values given in Table I were derived using equation (3) for a $t_{ramp} = 1$ μsec., and $\tau_G = R_{GK} C_{11}$ where $R_{GK} = 30\Omega$ and $C_{11}$ is as shown in Table I for each corresponding value of F. The turn-on di/dt in the column for thyristor (28) are those that occurred during turn-on of main thyristor 28. Similarly, the di/dt reading in the column for thyristor (13) are those that occurred during turn-on of pilot thyristor 13. The first four readings of di/dt for pilot thyristor 13 associated with $V_A = 400$ V and $I_G = 400$ ma were not determined.

From review of Table I, in particular for $V_A = 800$ V and $I_G = 200$ ma., it is evident that the largest percent reduction in the turn-on di/dt occurs for thyristor 13 changing from 550 to 360. However, the corresponding F value shows an increase from 1.00 to 18.5. Thus, for a relatively low decrease in the turn-on di/dt a corresponding relatively high improvement to the dv/dt capability of the device is realized as a consequence of utilizing capacitor 11, without any substantial degradation in the other capabilities of device 10.

Figure 2:
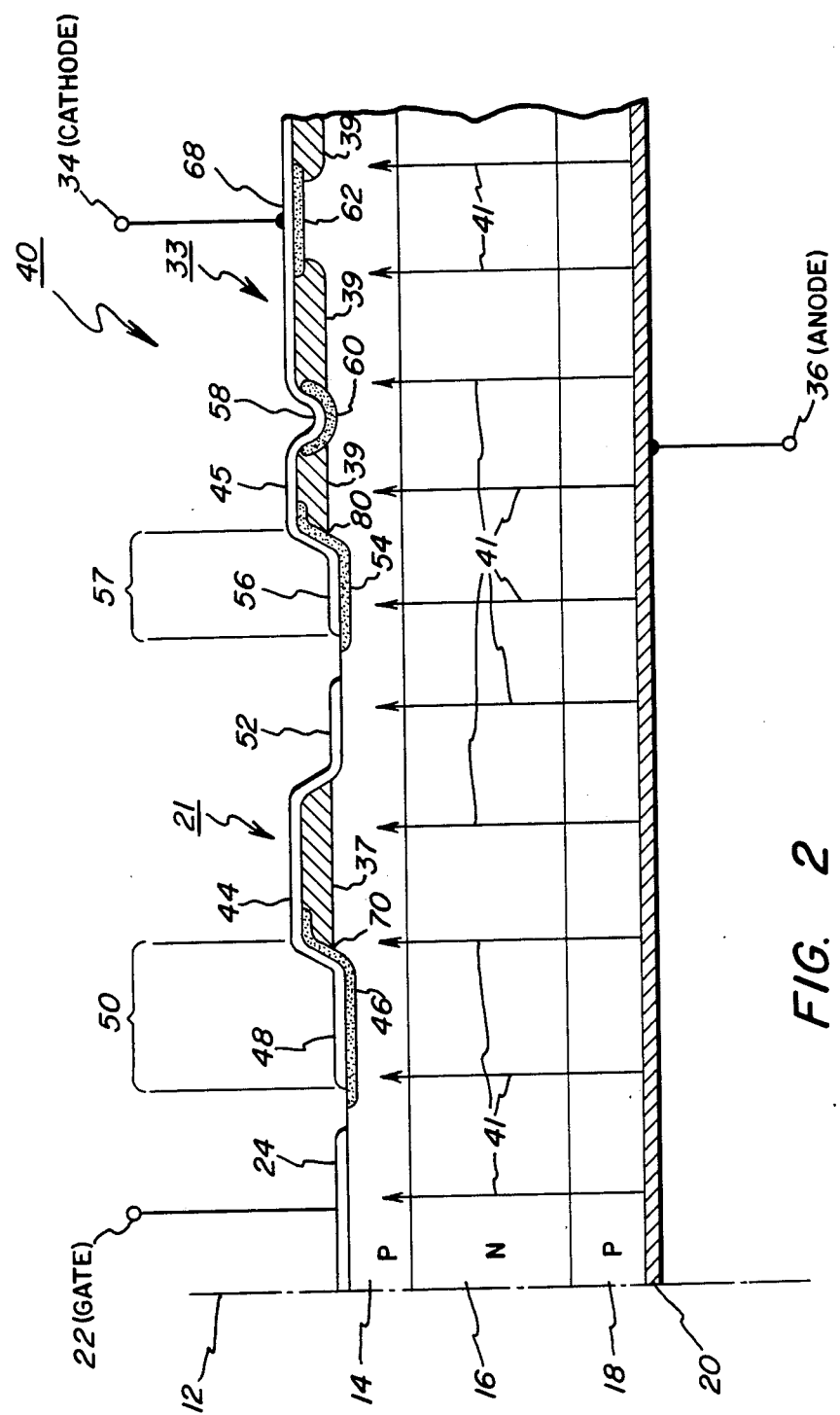
FIG. 2 is a partial cross-sectional view of a center-gated amplifying gate thyristor of the present invention in which internally insulative layers are employed to increase the dv/dt rating of the device.

A second embodiment of the present invention that uses built-in insulative layers to perform a function similar to that of externally connected impedance means 11 is shown in FIG. 2, which illustrates a partial cross-section of a center-gated amplifying gate thyristor 40 having a pilot thyristor 21 and a main thyristor 33. The layers 14, 16 and 18, transient capacitive charging currents 41, anode 20, and gate 24 have a similar structure and function as described for device 10 of FIG. 1.

Pilot thyristor 21 includes an emitter 37 formed of a high conductivity n+ layer upon which is overlaid a metallization layer 44, herein termed the pilot stage cathode electrode or first cathode electrode. Similarly, main thyristor 33 includes an emitter 39 formed of a high conductivity n+ layer upon which is overlaid a

TABLE I

| Anode Voltages and Gate Currents | $C_{11}$ (μfd) | Approximate F Values | Delay Time (μsec.) | di/dt (A/μsec.) Thyristor (28) | di/dt (A/μsec.) Thyristor (13) |
|---|---|---|---|---|---|
| $V_A$ = 400 V | 0 | 1.00 | 6.8 | 200 | 110 |
| $I_G$ = 200 ma | .02 | 1.29 | 8.4 | 200 | 110 |
|  | .04 | 1.77 | 10.0 | 200 | 100 |
|  | .06 | 2.35 | 11.6 | 200 | 100 |
|  | .08 | 2.93 | 13.2 | 200 | 100 |
|  | .10 | 3.53 | 14.8 | 200 | 100 |
|  | .20 | 6.50 | 20.3 | 200 | 100 |
|  | .30 | 9.50 | 26.5 | 200 | 100 |
|  | .40 | 12.50 | 32.2 | 200 | 100 |
|  | .50 | 15.50 | 38.0 | 200 | 100 |
| $V_A$ = 400 V | 0 | 1.00 | 3.6 | 230 | — |
| $I_G$ = 400 ma | .05 | 2.06 | 6.2 | 225 | — |
|  | .10 | 3.53 | 8.0 | 225 | — |
|  | .15 | 5.02 | 9.8 | 220 | — |
|  | .20 | 6.50 | 11.3 | 220 | 110 |
|  | .30 | 9.50 | 14.2 | 215 | 100 |
|  | .40 | 12.50 | 16.9 | 210 | 100 |
| $V_A$ = 800 V | 0 | 1.00 | 5.1 | 1100 | 550 |
| $I_G$ = 200 ma | .01 | 1.05 | 6.0 | 1150 | 500 |
|  | .02 | 1.29 | 6.8 | 1100 | 480 |
|  | .04 | 1.77 | 8.3 | 1050 | 440 |
|  | .05 | 2.06 | 9.0 | 1000 | 440 |
|  | .06 | 2.35 | 9.8 | 1000 | 440 |
|  | .08 | 2.93 | 11.3 | 1000 | 420 |
|  | .10 | 3.53 | 12.5 | 950 | 410 |
|  | .20 | 6.5 | 18.3 | 900 | 400 |
|  | .30 | 9.5 | 24.0 | 880 | 360 |
|  | .40 | 12.5 | 29.5 | 850 | 360 |
|  | .60 | 18.5 | 40.5 | 850 | 360 | metallization layer 45, herein termed the main stage cathode electrode or second cathode electrode.

An insulating layer 46, preferably comprising an oxide of semiconductor layers 14 and 37, is formed within layer 14 and emitter 37, and is located to contact and overlap turn-on line 70 of pilot thyristor 21 under the leading edge 48 of first cathode electrode 44. The mating of leading edge 48 with insulating layer 46 forms a layered arrangement 50. An insulating material 54 is formed within layer 14 and emitter 39 and located to contact and overlap turn-on line 80 of main thyristor 33 under the leading edge 56 of second cathode electrode 45. The mating of leading edge 56 with insulating layer 54 forms a layered arrangement 57.

With further regard to main thyristor 33, an insulating layer 60, preferably comprising an oxide of semiconductor layers 39 and 14, is formed within layer 14 and emitter 39, and is located in a complementary arrangement with a local region 58 of second cathode electrode 45 under which layer 39 has been etched away or otherwise removed. An alternative to local region 58 and insulator 60 is an insulating layer 62, preferably comprising an oxide of semiconductor layer 14 which is formed beneath second cathode electrode 45 and located in a local region 68 in which emitter 39 was intentionally not diffused or epitaxially grown. Insulating layers 46, 54, 60 and 62 have a thickness and area predetermined to control the capacitance of regions 50, 57, 58 and 68, respectively, in the same manner that capacitance $C_{11}$ was chosen or varied in the embodiment shown in FIG. 1.

The layered arrangements 50 and 57 provide built-in bypass capacitors for pilot thyristor 21 and main thyristor 33 respectively. These capacitors provide means for shunting the capacitive charging currents 41 generated by voltage transients impressed across the anode and second cathode, away from emitters 37 and 39 of pilot thyristor 21 and main thyristor 33 respectively. The shunt path for pilot thyristor 21 is provided by layered arrangement 50 diverting a portion of transient capacitive charging currents 41 to first cathode electrode 44. Similarly, the shunt path for main thyristor 33 is provided by layered arrangement 57 diverting a portion of transient capacitive charging currents 41 to second cathode electrode 45.

Device 40, shown in FIG. 2, having built-in bypass capacitors 50 and 57 within pilot thyristor 21 and main thyristor 33, respectively, accomplishes the same result as device 10 having impedance means 11, as shown in FIG. 1. Built-in capacitive values for layered arrangements 50 and 57 of device 40 in FIG. 2 provide approximately the same dv/dt improvement factor F, listed in Table I for corresponding capacitance values $C_{11}$, with the same degree of increase in turn-on time and reduction in di/dt rating, as for device 10.

The combination of local region 58 and insulating layer 60 provide a capacitive type "emitter short" in an etched defined type of emitter, as shown in FIG. 2. Similarly, the combination of insulating layer 62 positioned under second cathode electrode 45 in an area 68 in which the highly conductive material of emitter 39 has been removed provides a capacitive type "emitter short" in a diffusion defined type of emitter. These capacitive type emitter shorts positioned in main thyristor 33 reduce susceptibility to inadvertent turn-on of amplifying gate thyristor 40 in a manner similar to that occurring as a result of conventional emitter shorts as previously discussed. However, the capacitive emitter shorts of main thyristor 33 do not inhibit spreading of a plasma created upon initial turn-on of a thyristor, as compared to what occurs as a result of conventional emitter shorts. The capacitive emitter shorts of main thyristor 33 increase plasma spreading speed and thus are likely to increase the di/dt capability of device 40 while maintaining a high dv/dt capability.

It should be recognized that the density and area of local region 60 or 62 should be adjusted so that the dv/dt current flowing into each results in no more than a one-half band gap of voltage across the built-in capacitor. This will assure little injection from the adjacent n+ emitter P-base junctions. Note that some of the emitter shorts could be conventional ones. For example, conventional shorts could be alternated with capacitive shorts.

Figure 3:
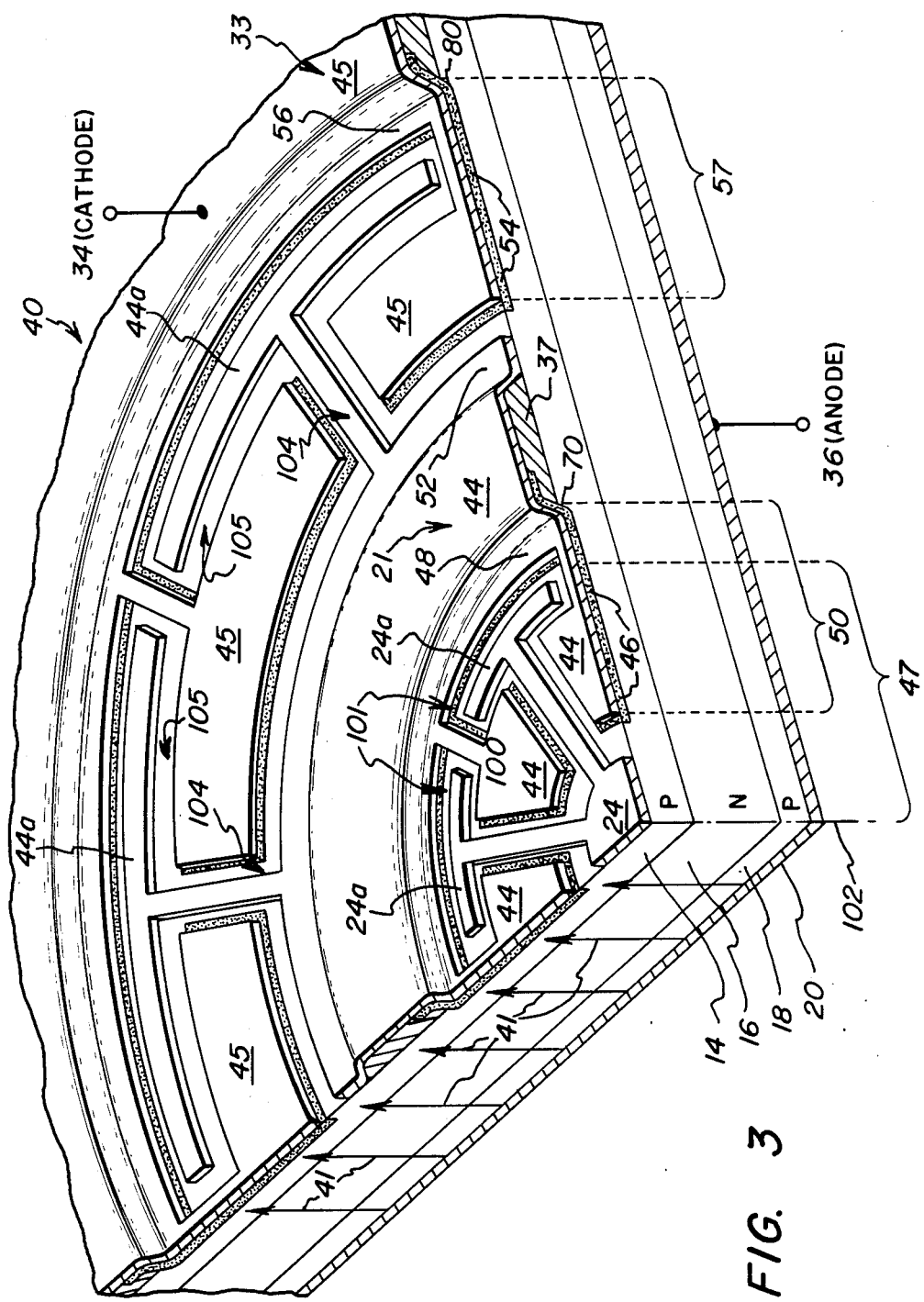
FIG. 3 is a perspective view partially in cross-section illustrating a preferred topography for the center-gated amplifying gate thryistor of FIG. 2.

FIG. 3 is a perspective view of a center-gated amplifying gate thyristor with the right-hand cross-section thereof similar to FIG. 2. Corresponding parts in FIGS. 2 and 3 have identical reference numerals. FIG. 3 illustrates a preferred topography of a device 40, and, in particular, illustrates preferred configurations of a gate metallization layer 24 and a first metallization layer 44 (or pilot stage cathode electrode) relative to the configurations of the layered arrangements or bypass capacitors 50 and 57, respectively. The bypass capacitor 50, it can be appreciated from FIG. 3, overlaps with a gate region 47 in the device 40. The bypass capacitor 50 improves the dv/dt capability of the first or pilot thyristor 21, and the bypass capacitor 57 improves the dv/dt capability of the second or main thyristor 44. It should be noted that the dv/dt capability of the amplifying gate thyristor 40 is the lower of the foregoing dv/dt capabilities. The various aspects of the inventive embodiment shown in FIG. 3, however, are not limited to a semiconductor device having an amplifying gate stage. To achieve a large dv/dt factor for the device 40 requires that the bypass capacitors 50 and 57 have large capacitance values, as indicated in Table I. One way of accomplishing this is to make the insulating layers 46 and 54 of the bypass capacitors 50 and 57 are thin. However, the insulating layers 46 and 54 cannot be made too thin, or else the breakdown voltage thereof will be reduced below a minimum desirable value. A minimum desirable breakdown voltage value for the bypass capacitor 50 is several times the maximum value of voltage that may appear between the leading edge 48 of the first metallization layer 44 and the closest portion of the gate metallization layer 24. A minimum desirable value for the bypass capacitor 57 is several times the maximum voltage between the leading edge 56 of the second metallization layer (or main cathode electrode) 45 and the closest portion of the section 52 of the first metallization layer 44. This maximum voltage will appear during the turn-on period. Therefore, in order to keep the breakdown voltage of the insulating layers 46 and 54 at a desirable level by having sufficient insulating layer thickness and still achieve high capacitance, the areas of the insulating layers 46 and 54 under the first and second metallization layers 44 and 45, respectively, and thus the areas of the bypass capacitors 50 and 57, must be made large. The configurations for the bypass capacitors 50 and 57, the gate metallization layer 24, and the first metallization layer 44, enable the device 40 of FIG. 3 to achieve large-area bypass capacitors 50 and 57 while rendering short the first stage gate current path between the gate metallization layer 24 and the first stage turn-on line 70, and likewise rendering short the second stage gate current path between the first metallization layer 44 and the second stage turn-on line 80.

In particular, such first stage gate current path between the gate metallization layer 24 and the first stage turn-on line 70 constitutes the portion of the cathode base layer 14 that couples portions 24a of the gate metallization layer 24 to the first stage turn-on line 70, and such second stage gate current path between the first metallization layer 44 and the second stage turn-on line 80 constitutes the portion of the cathode base layer 14 that couples portions 44a of the first metallization layer 44 to the second stage turn-on line 80.

By rendering short the first stage gate current path between the gate metallization layer 24 and the turn-on line 70, the resistance thereof is maintained low, and the following two advantages are obtained. First, the first stage gate current path impedance is kept low, which results in a lower gate threshold voltage to drive the gate current required for device turn-on. Second, the size of the voltage that appears across the bypass capacitor 50 during device turn-on is kept low. Similarly, by rendering short the second stage gate current path between the first metallization layer 44 and the turn-on line 80, the resistance thereof is maintained low, and the following two advantages are obtained. First, the second stage gate current path impedance is kept low, which results in a lower threshold voltage to turn-on the main thyristor 33. Second, the size of the voltage that appears across the bypass capacitor 57 during device turn-on is kept low.

In the particular configurations for the bypass capacitor 50 and the gate metallization layer 24 as shown in FIG. 3, the first insulating layer 46 and the part of the first metallization layer 44 disposed thereover include first channels 100 therein. Each of the first channels 100 includes a section 101, located proximate to the turn-on line 70 of the first cathode of the pilot thyristor 21. As viewed from a center 102 of the gate region 47, each of the first channels 100 is "T"-shaped. The portions 24a of the gate metallization layer 24 extend within the sections 101 of the channels 100, whereby the length of the first stage gate current path between the portions 24a and the turn-on line 70 is minimized, thereby reducing the resistance of the gate current path.

In the particular configuration for the bypass capacitor 57 and the first metallization layer 44 as shown in FIG. 3, the second insulating layer 54 and the part of the second metallization layer 45 disposed thereover include second channels 104. Each of the second channels 104 includes a section 105 located proximate to the turn-on line 80 of the second cathode of the main thyristor 33. As viewed from the center 102 of the gate region 47, each of the second channels 104 is T-shaped. Portions 44a of the first metallization layer 44 extend within the sections 105 of the channels 104, whereby the length of the second stage gate current path between the portions 44a and the turn-on line 80 is minimized, thereby reducing the resistance of the first stage gate current path.

It can be appreciated from the foregoing that the embodiment of the invention illustrated in FIG. 3 allows the capacitance of the bypass capacitors 50 and 57 to be large and yet determined substantially independently of the resistances of the first stage gate current path between the gate metallization layer 24 and the turn-on line 70 and the second stage gate current path between the first metallization layer 44 and the turn-on line 80, respectively. It will be apparent to those skilled in the art from the foregoing that the channels 100 and 104 can have other configurations than as shown and still have sections thereof disposed proximate to the respective turn-on lines 70 and 80.

Although amplifying gate thyristors have been described herein, it should be recognized that the described embodiments of this invention are also applicable to other semiconductor devices, such as thyristors and high voltage transistors. For a thyristor not having a pilot thyristor stage for amplifying the gate current, the described embodiments of this invention are also applicable to other semiconductor devices, such as thyristors and high voltage transistors. For a thyristor not having a pilot thyristor stage for amplifying the gate current, the described embodiments need only be utilized for the main thyristor stage. Similarly, for a high voltage transistor having two layers of alternating conductivity-type material similar to layers 14 and 16, the described embodiments need only be utilized to divert the capacitive charging current away from the emitter layers of the transistor whereby they are not amplified by the gain of the transistor.

It will now be appreciated that the described embodiments herein concern high voltage semiconductor devices allowing for relatively large improvement to the dv/dt rating of the devices and relatively low degradation to the other parameters of the devices. Still further, the described embodiment utilizing capacitive emitter shorts in the main thyristor emitter layer improves the di/dt capability of the device while maintaining the relatively high dv/dt capability of the device.

While the invention has been particularly shown and described with reference to several preferred embodiments thereof, it will be understood by those skilled in the art that various changes in form and detail may be made therein without departing from the true spirit and scope of the invention as defined by the appended claims.

What is claimed as my invention and desired to be secured by Letters Patent of the United States is:

1. A high voltage semiconductor device comprising:
an upper surface, a first cathode region including a first metallization layer and a first emitter region thereunder on said upper surface, a second cathode region including a second metallization layer and a second emitter region thereunder and separated by a distance from said first cathode region; said first and second emitter regions being of one conductivity type, a gate adapted to receive an applied signal; and an anode; said first cathode having a turn-on line approximately located at a leading edge of said first emitter region with respect to said gate; said second cathode having a turn-on line located approximately at a leading edge of the emitter region thereof with respect to said gate; said first and second cathodes being separated from said anode by a plurality of layers of alternating conductivity-type material, a first layer of said layers of alternating conductivity-type material being of opposite conductivity type and forming a portion of said upper surface and a junction with said first and second emitter regions, said gate electrode contacting said first layer of said layers of alternating conductivity-type material and said first and second cathodes being coupled to each other and to said gate by said first layer of said layers of alternating conductivity-type material; said second cathode and said anode being adapted to be coupled between opposite ends of a relatively high voltage potential source having periodic relatively high voltage transients so that periodic occurrences of the voltage transients generate capacitive charging currents within said layers of alternating conductivity-type material, said high voltage semiconductor device further comprising:

capacitive means for diverting a portion of transient generated capacitive charging currents flowing within said layers of alternating conductivity-type material beneath said gate away from said first and second emitter regions and the portion of said first layer lying thereunder, such that the transient generated capacitive charging currents which are manifested as the gate current are reduced with minimal effect on other parameters of said device, thereby improving the dv/dt capability of said device;

said capacitive means comprising:

a first insulating layer disposed within said first emitter region of said first cathode and a portion of said first layer adjacent a leading edge of said first emitter region and overlapping the turn-on line of said first cathode, said first metallization layer contacting said first emitter region and including a first metallization extension overlying said first insulating layer and also overlying said leading edge of said first emitter region and overlapping said turn-on line thereof without directly contacting said first layer; and a second insulating layer disposed within said second emitter region of said second cathode and a portion of said first layer adjacent a leading edge of said second emitter region and overlapping the turn-on line of said second cathode, said second metallization contacting said second emitter region and including a second metallization extension overlying said second insulating layer and also overlying said leading edge of said second emitter region and overlapping said turn-on line thereof.

2. The high voltage semiconductor device according to claim 1 wherein said anode is of opposite type conductivity and said plurality of layers of alternating conductivity-type material further includes a second layer of one type conductivity.

3. The high voltage semiconductor device according to claim 2 wherein said second cathode region is located adjacent said gate.

4. The high voltage semiconductor device according to claims 1, 2 or 3 wherein said gate is a light responsive gate and a portion of said gate is arranged to receive incident light radiation impinging on said gate, said gate being substantially unobstructed to said light radiation.

5. The high voltage semiconductor device according to claims 1 or 2 wherein said device further includes a cavity portion extending into said upper surface of said device said second cathode region further comprising at least one further insulating layer extending into cavity portion of said first layer of alternating conductivity-type material, said metallization layer including a further metallization extension overlying and abutting said further insulating layer and said cavity portion.

6. The high voltage semiconductor device according to claims 1, 2 or 3 wherein said first insulating layer comprises an oxide of the semiconductor material of said first emitter region and of the semiconductor material of said first layer; and wherein said second insulating layer comprises an oxide of the semiconductor material of said second emitter region and of the semiconductor material of said first layer.

7. The high voltage semiconductor device according to claim 1 wherein said gate comprises a gate metallization layer.

8. In a high voltage semiconductor device having at least one cathode including a metallization layer and an emitter layer thereunder, a gate region, and an anode, said gate region being adapted to receive an applied signal, said cathode being separated from said anode by a plurality of layers of alternating conductivity-type material including at least a first layer, said gate region overlying and contacting at least a portion of said first layer, said first layer coupling said cathode to said gate region, said cathode and said anode being adapted to be coupled across a relatively high voltage source, the improvement comprising:

said emitter layer of said cathode being interrupted at a location; and at least one cavity portion extending through said emitter layer and into said first layer of alternating conductivity-type material and defining a cavity surface; an insulating layer extending into said cavity portion; one side of the portion of said insulating layer within said cavity abutting the underside of said metallization layer at said location where said emitter layer of said cathode is interrupted; and another side of the portion of said insulating layer within said cavity abutting said cavity surface; said insulating layer in combination with said emitter layer establishing an embedded capacitor for diverting transient currents and improving the dv/dt capability of the device so as to enhance the speed at which a plasma, created upon initial turn-on of said device, spreads.

9. In a high voltage semiconductor device having at least one cathode including a metallization layer and an emitter layer thereunder, a gate region, and an anode, said gate region being adapted to receive an applied signal, said cathode being separated from said anode by a plurality of layers of alternating conductivity-type material including at least a first layer, said first layer coupling said cathode to said gate region, said cathode and said anode being adapted to be coupled across a relatively high voltage source, the improvement comprising:

at least one cavity portion extending through said emitter layer and into said first layer of alternating conductivity-type material; an insulating layer extending into said cavity portion; an upper side of said insulating layer abutting said metallization layer and a lower side of said insulating layer abutting only said first layer and a portion of said emitter layer, said portion of said emitter layer surrounding a portion of said insulating layer; so as to enhance the speed at which a plasma, created upon initial turn-on of said device, spreads.

* * * * *